US009869692B2

(12) United States Patent
Ullrich (10) Patent No.: US 9,869,692 B2
(45) Date of Patent: Jan. 16, 2018

(54) MICROMECHANICAL Z-SENSOR (71) Applicant: Robert Bosch GmbH, Stuttgart (DE)

(72) Inventor: Guenther-Nino-Carlo Ullrich, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 325 days.

(21) Appl. No.: 14/536,034

(22) Filed: Nov. 7, 2014

(65) Prior Publication Data
US 2015/0143907 A1 May 28, 2015

(30) Foreign Application Priority Data

Nov. 8, 2013 (DE) .................. 10 2013 222 747

(51) Int. Cl.
*G01P 15/125* (2006.01)
*B81B 3/00* (2006.01)
*G01P 15/08* (2006.01)

(52) U.S. Cl.
CPC .......... *G01P 15/125* (2013.01); *B81B 3/0051* (2013.01); *B81B 2201/0235* (2013.01); *B81B 2203/053* (2013.01); *G01P 2015/0831* (2013.01); *G01P 2015/0871* (2013.01); *Y10T 29/49002* (2015.01)

(58) Field of Classification Search
CPC .......... G01P 15/125; G01P 2015/0831; G01P 2015/0871; B81B 3/0051; B81B 2201/0235; B81B 2203/053; Y10T 29/49002
USPC ...................................... 73/514.32
See application file for complete search history.

(56) References Cited

U.S. PATENT DOCUMENTS

| 4,928,203 A | * | 5/1990 | Swindal | .................. | G01P 1/003 |
| | | | | | 361/280 |
| 5,211,051 A | * | 5/1993 | Kaiser | ................. | G01P 15/0894 |
| | | | | | 73/1.38 |
| 7,736,931 B1 | * | 6/2010 | Guo | ........................ | G01P 15/02 |
| | | | | | 257/E21.613 |

(Continued)

FOREIGN PATENT DOCUMENTS

| DE | 10 116 931 | 10/2002 |
| DE | 10 2007 060878 | 6/2009 |

(Continued)

OTHER PUBLICATIONS

"Surface micromechanics sensors as electric test structures for characterizing their manufacturing processes," Maute, Matthias ; University of Tuebingen, Germany, 2003.

*Primary Examiner* — Lisa Caputo
*Assistant Examiner* — Nathaniel T Woodward
(74) *Attorney, Agent, or Firm* — Norton Rose Fulbright US LLP; Gerard Messina (57) ABSTRACT

A micromechanical Z-sensor, including a rocker having trough structures which is twistably supported with the aid of a spring device, the rocker having a mass distribution which is asymmetric with respect to the spring device, first electrodes situated above the trough structure, and second electrodes situated below the rocker, and a catch device including at least one spring element against which a stop element which is anchored to a substrate is able to strike, at least two catch devices which are spatially separated from each other being provided per rocker arm of the rocker.

12 Claims, 9 Drawing Sheets

(56) References Cited

U.S. PATENT DOCUMENTS

| | | | | |
|---|---|---|---|---|
| 8,124,895 B2* | 2/2012 | Merassi | ................ | B81B 3/0051 |
| | | | | 200/61.53 |
| 2009/0308159 A1* | 12/2009 | Frey | ..................... | B81B 3/0051 |
| | | | | 73/514.32 |
| 2010/0175473 A1* | 7/2010 | Classen | ................ | G01P 15/125 |
| | | | | 73/514.29 |
| 2010/0186508 A1* | 7/2010 | Guenther | ............... | G01C 25/00 |
| | | | | 73/504.14 |
| 2011/0048131 A1* | 3/2011 | Reinmuth | ............ | B81B 3/0051 |
| | | | | 73/504.12 |
| 2011/0296917 A1* | 12/2011 | Reinmuth | ............. | G01B 7/085 |
| | | | | 73/514.32 |
| 2012/0031185 A1* | 2/2012 | Classen | ................ | G01P 15/125 |
| | | | | 73/514.14 |
| 2013/0299923 A1* | 11/2013 | Classen | ................ | B81B 3/0018 |
| | | | | 257/415 |

FOREIGN PATENT DOCUMENTS

| | | |
|---|---|---|
| DE | 10 2009 000167 | 7/2010 |
| EP | 0 244 581 | 11/1987 |
| EP | 0 773 443 | 5/1997 |

* cited by examiner

MICROMECHANICAL Z-SENSOR

RELATED APPLICATION INFORMATION

The present application claims priority to and the benefit of German patent application no. 10 2013 222 747.7, which was filed in Germany on Nov. 8, 2013, the disclosure of which is incorporated herein by reference.

FIELD OF THE INVENTION

The present invention relates to a micromechanical Z-sensor. The present invention furthermore relates to a method for manufacturing a micromechanical Z-sensor.

BACKGROUND INFORMATION

Conventional sensors for measuring physical acceleration typically have a micromechanical structure made of silicon (sensor core) and an electronic evaluation system. Sensor cores which make it possible to measure an acceleration in a direction orthogonal to a main plane of the sensor core are referred to as Z-sensors. Such sensors are used in the automobile sector, for example, in ESP systems, or in the mobile telephony sector.

The aforementioned sensor principle is, for example, discussed in greater detail in Chapter 6 of the dissertation "Surface micromechanics sensors as electric test structures for characterizing their manufacturing processes;" Maute, Matthias; University of Tübingen, Germany, 2003.

Patent document EP 0 244 581 discusses a micromechanical sensor for the purpose of automatic triggering of occupant protection devices.

Patent document EP 0 773 443 B1 discusses a micromechanical acceleration sensor.

Within the scope of the so-called "FP functionalization," which, for example, is discussed in DE 10 2007 060 878 A1 and DE 10 2009 000 167 A1, a rocker is formed for the micromechanical acceleration sensor which is structured in two different silicon layers, rather than from only a single compact layer. Thus, movable "trough-shaped" structures may be formed.

When handling the acceleration sensor, in the event of a sudden overload (for example, if a control device including the acceleration sensor is dropped), the mass and thus the spring may be deflected in the vertical direction (i.e., out of plane). A mass of an FP functional layer may thereby pull out an upper electrode or the FP functional layer itself may also be destroyed.

In order to prevent this, mechanical stops have been provided, which are described, for example, in DE 10 116 931 A1. The stops described there block the rocker only after approximately 7 μm, up to approximately 10 μm. However, since, in the aforementioned technology having FP functionalization, the rocker is situated between the two electrodes and the electrodes are less than 2 μm from each other, this conventional overload protection is no longer sufficient. Therefore, additional structures have been configured which are able to stop the rocker before it reaches the stop. Such mechanical stops are discussed in DE 10 2009 029 095 A1 and U.S. Pat. No. 8,124,895 B2.

SUMMARY OF THE INVENTION

An object of the present invention is to provide a micromechanical Z-sensor having an improved stop protection.

This object may be achieved according to a first aspect using a micromechanical Z-sensor including:
- a rocker having trough structures which is twistably supported with the aid of a spring device, the rocker having a mass distribution which is asymmetric with respect to the spring device;
- first electrodes situated above the trough structure; and second electrodes situated below the rocker; and
- a catch device including at least one spring element against which a stop element which is anchored to a substrate is able to strike, at least two catch devices which are spatially separated from each other being provided per rocker arm of the rocker.

According to a second aspect, the object is achieved using a method for manufacturing a micromechanical Z-sensor, including the steps of:
- providing an asymmetrically formed rocker made up of at least two functional layers;
- forming at least two catch devices which are spatially separated from each other per rocker arm,
- a formation of spring elements being carried out in the lowest functional layer of the rocker; stop elements being formed in such a way that stop elements 52 are anchored to the substrate 1, a stop area of the stop elements 52 protruding onto a stop surface of the spring elements 51.

According to the present invention, the known "stirrup principle" is improved and optimized. The impact energy of the rocker is able to be distributed better with the aid of the at least two catch devices which are spatially separated from each other per rocker arm or rocker half, thus providing an efficient protection of the rocker from breaking.

Specific embodiments of the device according to the present invention and of the method according to the present invention are the subject matter of subclaims.

One specific embodiment of the Z-sensor according to the present invention is characterized in that the spring element is formed as a recess in the rocker having a bottom surface formed in a third functional layer. In this way, an FP functional layer situated at the very bottom may be used as a spring element for the catch device in one manufacturing process of the Z-sensor which is carried out with the aid of multiple functional layers. In this way, both the aforementioned trough-shaped structure of the rocker and the catch device according to the present invention may advantageously be implemented.

Additional specific embodiments of the Z-sensor according to the present invention are characterized in that a surface of the stop element provided for striking the spring element is formed narrowly or broadly in relation to a width on the spring element. In this way, it is possible to implement hard or soft damping structures, depending on the requirement.

One additional specific embodiment of the Z-sensor according to the present invention is characterized in that at least two stop elements are situated opposite each other outside of an outline of the rocker, with respect to a base of the rocker. Alternative stop or damping designs may be implemented with the aid of this variant, which does not provide stop elements anchored to the substrate.

Another specific embodiment of the Z-sensor according to the present invention is characterized in that the spring element has perforations. The aforementioned perforations are required for providing an access for etching gas, the perforation being able to be used for dimensioning elastic properties of the spring element.

Another specific embodiment of the Z-sensor according to the present invention provides that a size of the perforations is dimensionable. In this way, elastic properties of the spring element may be dimensioned.

According to another specific embodiment of the Z-sensor according to the present invention, it is provided that the Z-sensor furthermore includes at least one relief device which is formed in the shape of a slot which penetrates all layers of the rocker. In this way, the overall structure may advantageously be configured to be less rigid and more flexible in that the slot mechanically decouples individual areas of the rocker from each other.

Another specific embodiment of the Z-sensor according to the present invention provides that the slot is formed around the catch device. In this way, the catch device is itself refined into a kind of spring element, thereby advantageously influencing elastic properties of the rocker structure.

The present invention is described in greater detail below having additional features and advantages, based on multiple figures. In this context, all described or illustrated features, individually or in any arbitrary combination, constitute the subject matter of the present invention, regardless of their recapitulation in the patent claims or their back-reference, and regardless of their wording and representation in the description and in the figures. Identical or functionally identical elements have the same reference numerals.

DETAILED DESCRIPTION

Figure 1:
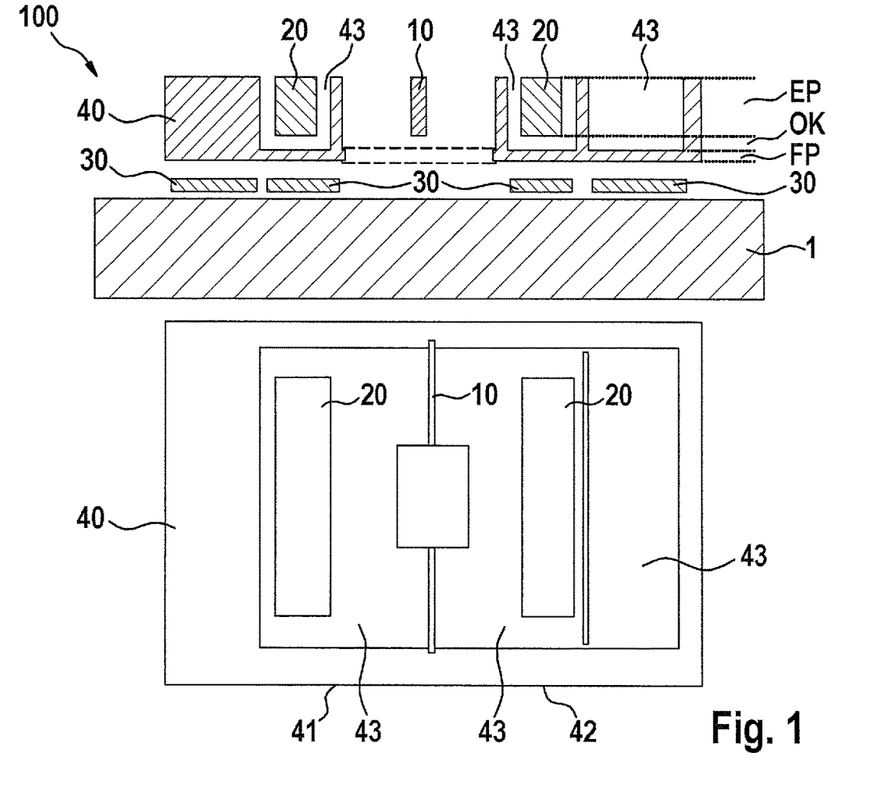
FIG. 1 shows a conventional micromechanical Z-acceleration sensor in a schematic side view and a top view.

FIG. 1 shows a micromechanical Z-sensor (for example, an acceleration sensor) according to the related art in a highly simplified manner, in a sectional view (upper illustration) and in a top view (lower illustration). Micromechanical Z-sensor 100 includes a perforated movable flat rocker 40. The perforation (not shown) of rocker 40 is caused by etching processes during manufacturing and essentially completely covers the rocker area. The structure of rocker 40 is rotatably or twistably supported on a silicon substrate or suspended on it with the aid of a spring device 10 which may be formed as a torsion spring having a defined rigidity. It is apparent that rocker arms 41, 42 are formed asymmetrically due to unequal mass distributions with respect to spring device 10. In the case of essentially equally long rocker arms 41, 42 (geometrical symmetry), the asymmetry may be formed by an asymmetric mass distribution of rocker arms 41, 42, for example, by different perforations of arms 41, 42 or by different thicknesses of the two rocker arms 41, 42. However, the asymmetry may additionally or alternatively also be achieved by an asymmetry of a geometry of the two rocker arms 41, 42 (for example, different arm lengths).

In FIG. 1, the aforementioned asymmetry is indicated by different lengths of the two rocker arms 41, 42 (high-mass rocker arm 41, low-mass rocker arm 42). As a result of an acceleration acting orthogonally to a main plane of rocker 40 (vertical acceleration), the structure of rocker 40 may twist about the torsion axis due to the asymmetry of the two rocker arms 41, 42. Rocker 40 is kept at a defined electric potential by an electronic circuit (not shown). Fixed second electrodes 30 situated below rocker 40 which are used for measuring purposes are kept at different defined electric potentials. "Trough-shaped" structures 43 of rocker 40 are apparent, first fixed electrodes 20 being situated above trough-shaped structures 43.

A change in inclination of rocker 40 is detected with the aid of an electronic evaluation device (not shown) via a detection and evaluation of changes in charge on electrodes 20, 30. In this way, it is possible to ascertain a vertical acceleration ("in the z-direction") acting on micromechanical Z-sensor 100.

Furthermore, the sectional view schematically shows that the overall structure of rocker 40 is implemented from three functional layers, i.e., from an upper first functional layer (EP layer), from a second functional layer (OK layer) situated between the EP layer and a third functional layer (FP layer), and the lower FP layer. The OK layer may be omitted if necessary.

Multiple mechanical stops (not shown) in substrate 1 are to ensure that in the case of an overload, the rocker structure strikes at defined points on substrate 1, and in the case of lateral ("in-plane") overload accelerations, are to prevent rocker 40 from reaching or exceeding a critical deflection. In this way, Z-sensor 100 is to be protected effectively from a mechanical overload in the main plane with resulting damage.

Figure 2:
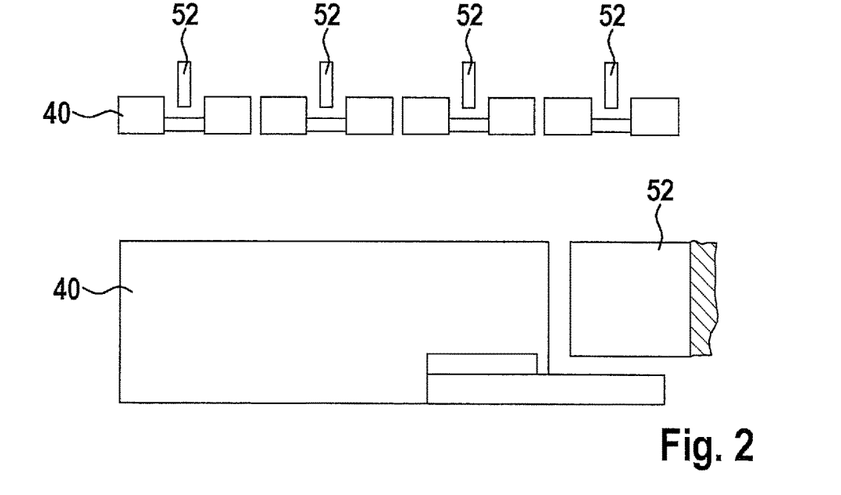
FIG. 2 shows a schematic representation of a stop principle of a conventional micromechanical Z-acceleration sensor.

The basic idea described in the related art (for example, DE 10 2009 029 095 A1) of a mechanical stop for FP-functionalized micromechanical acceleration sensors is schematically depicted in FIG. 2 in a front view (upper illustration) and in a side view (lower illustration). A principle is provided for damping impact energy which may result if the mass of rocker 40 moves upward. In this case, the freedom of movement of rocker 40 is limited with the aid of a fixed stop in the form of multiple stop elements 52. If the mass of rocker 40 moves upward, its freedom of movement is limited by stop elements 52. This design element is generally referred to as a so-called "stirrup."

According to the present invention, it is henceforth provided that a specifically improved design of a stop device or catch device 50 is provided for rocker 40.

FIG. 3 shows details of a first specific embodiment of Z-sensor 100 according to the present invention in multiple schematic representations. FIG. 3a shows a perspective view of a quarter of rocker 40 including the spring device 10, a catch device 50 being apparent.

Figure 3A:
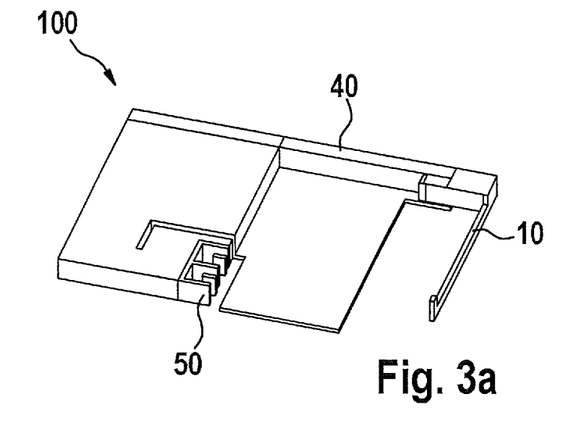
FIGS. 3a, 3b, 3c and 3d show multiple views of one specific embodiment of the micromechanical Z-sensor.
Figure 3B:
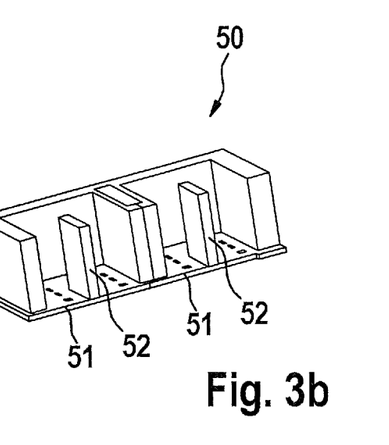
Figure 3C:
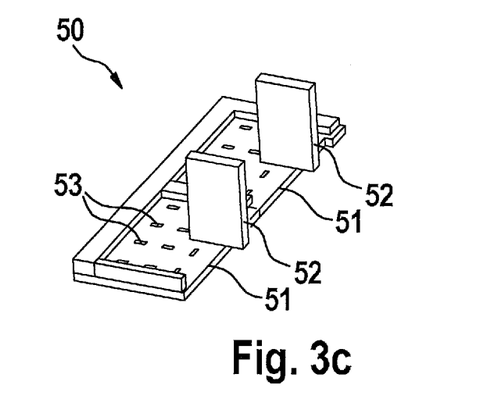

FIG. 3b shows a detailed perspective view of catch device 50. Spring elements 51 are formed in the FP functional layer of rocker 40, against which stop elements 52, whose lower section, which is connected to the so-called "mainland" substrate, may strike. For this purpose, as shown in FIG. 3c, stop elements 52 overhang spring elements 51 to a certain extent, so that in the event of impact, spring elements 51 are able to deform dynamically via the impact of stop elements 52. In this way, it is possible to absorb or dampen mechanical stop or impact energy efficiently. Spring elements 51 have perforations 53 which are caused by underlying layers being able to be etched away during the manufacturing process with the aid of an etching gas. The size of the perforation holes of perforations 53 may be dimensioned in such a way that a design parameter is provided for spring element 51 in this way. However, it is also conceivable to omit perforations 53 of spring elements 51 altogether.

Figure 3D:
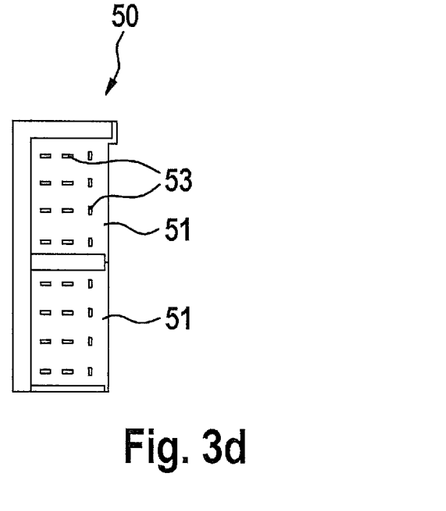

FIG. 3d shows a top view of one variant of catch device 50. It is conceivable that, for example, the corners of spring elements 51 which are adjacent to the massive rocker material may be rounded. It is also conceivable to change a shape of stop elements 52 in the area of the connection to the substrate (not shown) in order to design a force application effect into the substrate in a defined manner in this way.

Due to the relatively large stop surface of spring elements 51 in relation to an impact surface of stop elements 52 on spring elements 51, it is possible to achieve particularly advantageous mechanical properties of catch device 50.

Figure 4:
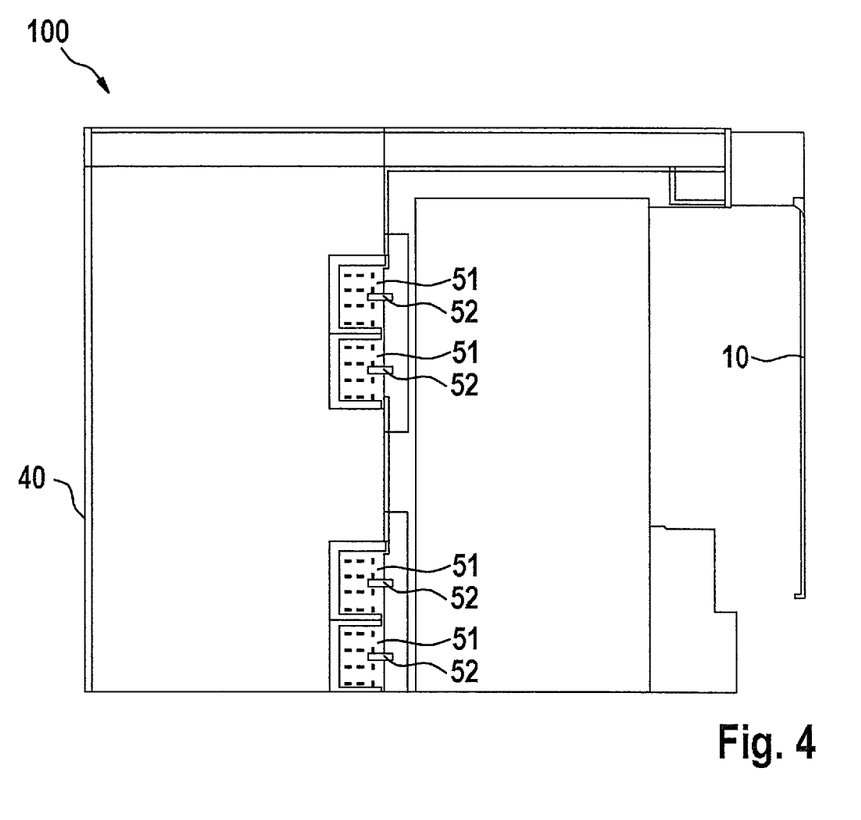
FIG. 4 shows a top view of another specific embodiment of the micromechanical Z-sensor.

FIG. 4 shows a top view of another specific embodiment of Z-sensor 100 according to the present invention. To provide a better overview in this case as well, only a quarter of rocker 40 is again shown, in this case, two of the aforementioned catch devices or receiving structures 50 being apparent per rocker quarter.

Figures 5A, 5B, 5C:
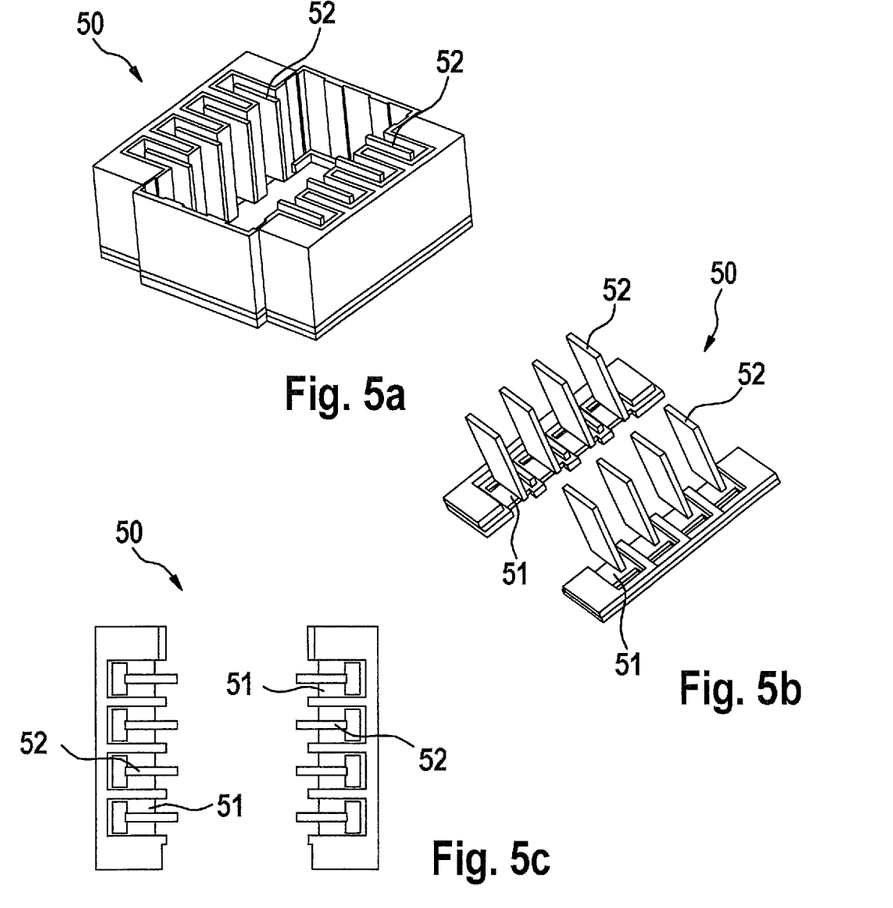
FIGS. 5a, 5b, 5c and 5d show multiple perspective views of another specific embodiment of the micromechanical Z-sensor according to the present invention.
Figure 5D:
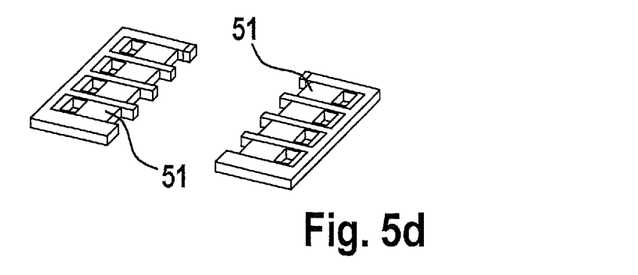

FIG. 5 shows multiple views of a particularly rigid embodiment of catch device 50 according to the present invention, which is achieved in that the surface of spring elements 51 is formed small in relation to a contact surface with stop elements 52. In addition, a number of spring elements 51 per catch device 50 is relatively large, so that as a result, a relatively hard damping effect may be achieved for rocker 40 (not shown in FIG. 5) with the aid of catch device 50 shown in FIGS. 5a through 5d.

Figure 6A:
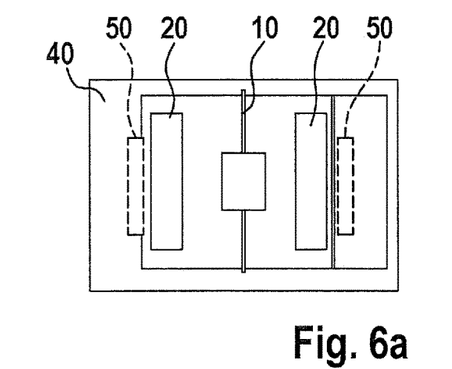
FIGS. 6a, 6b, 6c and 6d show multiple top views of specific embodiments of the Z-sensor according to the present invention.
Figure 6B:
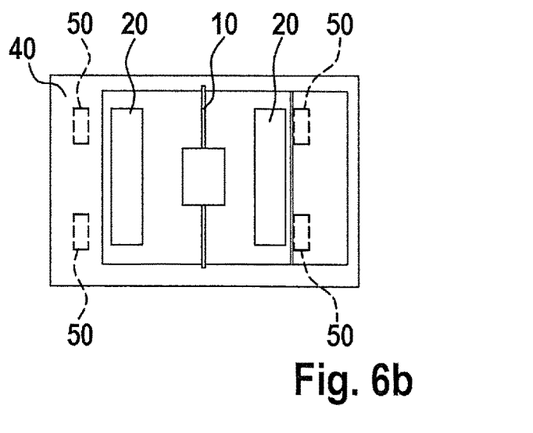
Figure 6C:
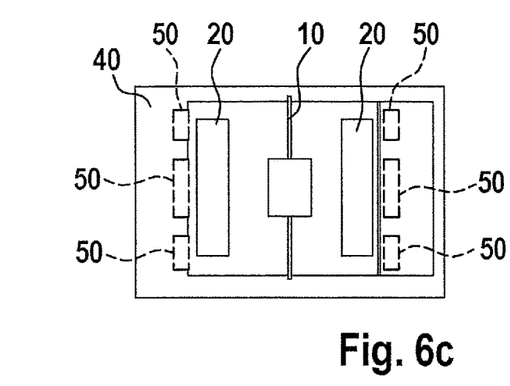

FIGS. 6a through 6d qualitatively illustrate some exemplary geometric positions for catch device 50 within rocker 40. It has been found that the conventional variant of FIG. 6a and the variant according to the present invention of FIG. 6c are able to absorb a particularly large amount of mechanical energy.

In the variants according to the present invention of FIG. 6b and FIG. 6c, it is apparent that either two or three catch devices 50 which are situated spatially separated from each other are provided per rocker arm 41, 42.

Figure 6D:
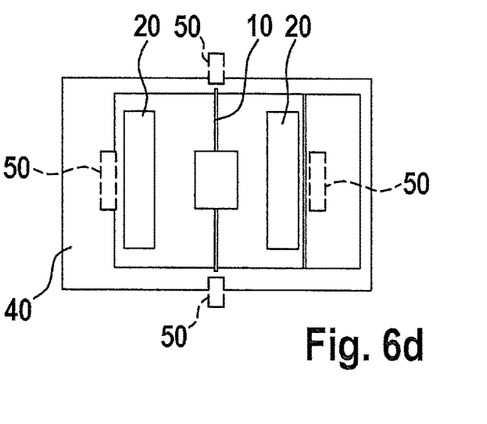

FIG. 6d shows another advantageous variant according to the present invention which is characterized in that two catch devices 50 are situated outside a base of rocker 40 on opposite sides of rocker 40 in the area of spring device 10, stop elements 52 (not shown) projecting to some extent from outside into catch devices 50. In this way, alternative damping effects may be achieved, via which additional areas of rocker 40 may be protected from overload.

At this point, it must be mentioned that a number or an arrangement of catch devices 50 is of course arbitrarily variable, so that, for example, a desired damping effect may be optimally dimensioned or adapted to a rocker 40 with the aid of simulation processes. The numbers and arrangements of catch devices 50 of FIGS. 6a through 6d are therefore to be regarded only as exemplary.

Figure 7A:
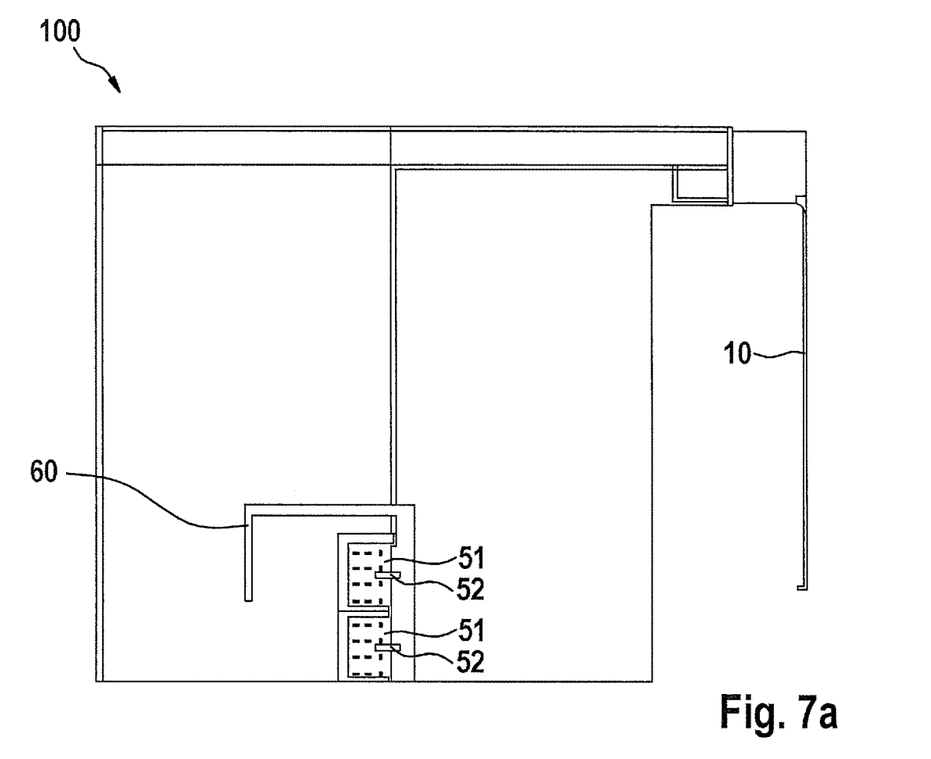
FIGS. 7a and 7b show a top view and a perspective view of another specific embodiment of the micromechanical Z-sensor.
Figure 7B:
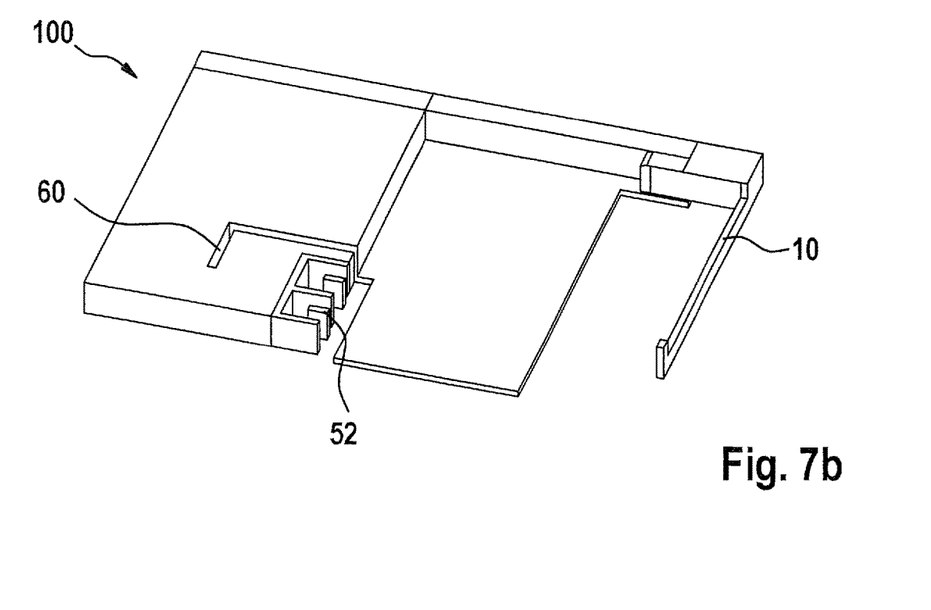

FIG. 7a and FIG. 7b show additional measures for the improved absorption of impact energy for micromechanical Z-sensor 100. In this case, in addition to catch device 50, a release device 60 is provided in the form of a narrow slot which is formed through all layers of rocker 40 and is used to make rocker 40 more elastic overall.

In addition, release device 60 is also used for a reduction of the rigidity of rocker 40, in order thereby to make possible the absorption of deformation energy which otherwise would have to be absorbed by spring elements 51. The slots are to influence the deformation of rocker 40 in such a way that all spring elements 51 may be equally loaded. With the aid of specific formations or arrangements of the slots within rocker 40, it is possible in this way to better absorb the impact energy, since individual areas of rocker 40 are mechanically decoupled from each other in this way and mechanical tensions within rocker 40 are advantageously reduced as a result.

Figure 8:
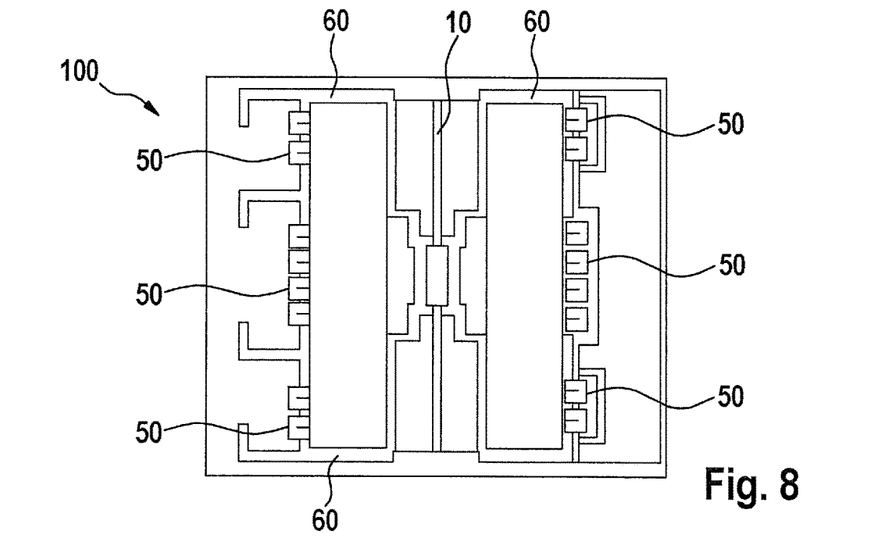
FIG. 8 shows a detailed view of a catch device of another specific embodiment of the micromechanical Z-sensor according to the present invention.

FIG. 8 shows multiple arrangements of such slots in rocker 40, it being apparent that a shape of slots 60 may be configured to be highly flexible.

Figure 9:
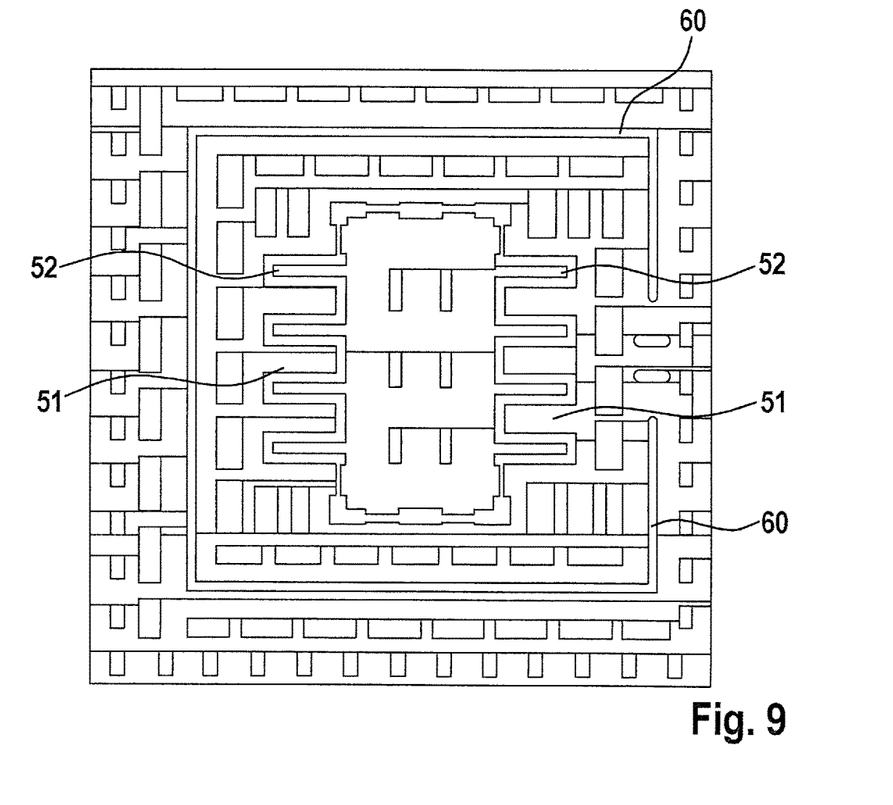
FIG. 9 shows a detailed view of a catch device of another specific embodiment of the micromechanical Z-sensor according to the present invention.

In FIG. 9, it is schematically indicated that a slot is formed essentially in a ring-like manner around catch device 50. In this way, the entire catch device 50 is formed as a kind of mechanical spring which is connected by only a relatively small portion to the mass of rocker 40.

Figure 10A:
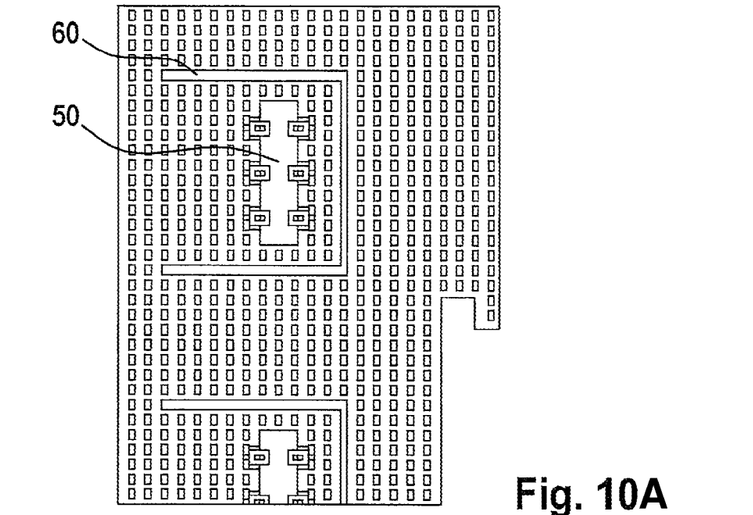
FIGS. 10A and 10B show variants of a catch device and a relief device of additional specific embodiments of the micromechanical Z-sensor.
Figure 10B:
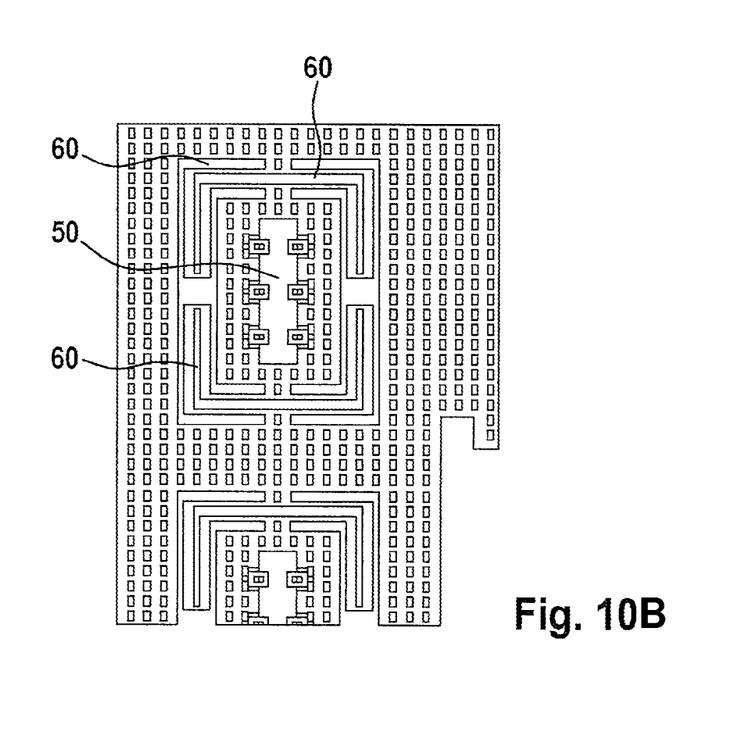

FIGS. 10A and 10B show additional specific embodiments of release device 60 in the form of slots, it being apparent that an array of variations of the slots is virtually unlimited. In particular, as shown schematically in FIG. 10b, it may be provided that multiple slots are also formed in a ring-like manner around catch device 50, in order to achieve a particularly flexible connection of catch device 50 to rocker 40 in this way.

Figure 11:
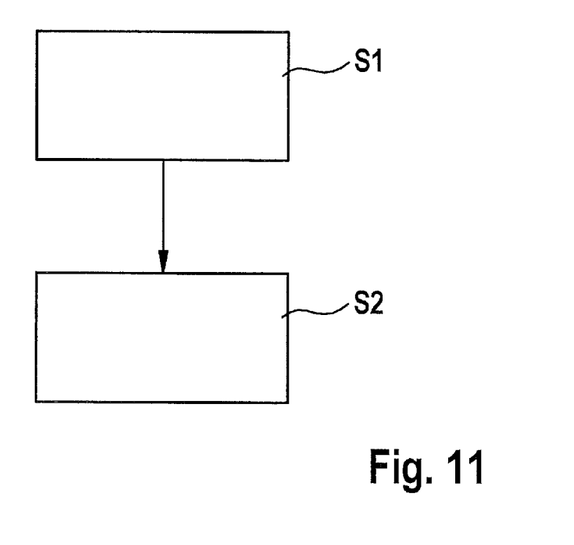
FIG. 11 shows a basic sequence of one specific embodiment of the method according to the present invention.

FIG. 11 shows a schematic flow chart of one specific embodiment of the method according to the present invention.

In a first step S1, an asymmetrically formed rocker 40 is provided which is made up of at least two functional layers EP, FP.

In a second step S2, a formation of at least two catch devices which are spatially separated from each other is carried out per rocker arm, a formation of spring elements FP of the rocker being carried out, a formation of stop elements 52 being carried out in such a way that stop elements 52 are anchored to the substrate, a stop area of stop elements 52 protruding onto a stop surface of spring elements 51.

In summary, the present invention provides a micromechanical Z-sensor and a method for manufacturing a micromechanical Z-sensor, with the aid of which an effective damping of impact energy is possible for FP-functionalized micromechanical acceleration sensors. With the aid of a specific embodiment and arrangement of spring elements in interaction with stop elements anchored on the mainland according to the stirrup principle, it is possible to absorb the mechanical impact energy in an improved manner and thus provide an effective protection for the sensor device in the event of impact.

Due to the great array of variations of the catch device and the release device, it is possible to achieve an optimal damping of the impact energy for each individual sensor device in this way.

Although the present invention has been described based on specific embodiments, it is in no way limited to them. Those skilled in the art will recognize that manifold modifications which were not described above are possible without deviating from the core of the present invention. In particular, it is also possible to use the principle according to the present invention on other sensor technologies, for example, on piezoresistive micromechanical acceleration sensors.

What is claimed is:

1. A micromechanical Z-sensor, comprising:
a rocker having trough structures which is twistably supported with the aid of a spring device, the rocker having a mass distribution which is asymmetric with respect to the spring device;
first electrodes situated above the trough structure;
second electrodes situated below the rocker; and
at least two catch devices, each catch device including at least one spring element against which a stop element which is anchored to a substrate is able to strike;
wherein the at least two catch devices are spatially separated from each other and are provided per rocker arm of the rocker;
wherein the stop element includes a strike surface, the stop element strike surface having a first region and a second region;
wherein the first region of the stop element strike surface is coplanar with the second region of the stop element strike surface;
wherein the at least one spring element includes a strike surface; and
wherein the strike surface of the stop element overhangs the strike surface of the at least one spring element so that the first region of the stop element strike surface contacts the strike surface of the at least one spring element when the rocker deflects, and the second region of the stop element strike surface does not contact the strike surface of the at least one spring element when the rocker deflects.

2. The Z-sensor of claim 1, wherein the spring element is formed as a recess in the rocker having a bottom surface formed in a functional layer.

3. The Z-sensor of claim 1, wherein a surface of the stop element for striking the spring element is formed narrowly or broadly in relation to a width on the spring element.

4. The Z-sensor of claim 1, wherein at least two stop elements are situated opposite each other outside of an outline of the rocker, with respect to a base of the rocker.

5. The Z-sensor of claim 1, wherein the spring element has perforations.

6. The Z-sensor of claim 5, wherein a size of the perforations corresponds to elastic properties of the spring element.

7. The Z-sensor of claim 1, further comprising:
at least one release device which is formed in the shape of a slot which penetrates all layers of the rocker.

8. The Z-sensor of claim 7, wherein the slot is formed around the catch device.

9. A method for manufacturing a micromechanical Z-sensor, the method comprising:
providing an asymmetrically formed rocker made up of at least two functional layers;
forming at least two catch devices which are spatially separated from each other per rocker arm, a formation of spring elements being carried out in the lowest functional layer of the rocker; and
forming stop elements so that the stop elements are anchored to the substrate, a stop area of the stop elements protruding onto a stop surface of the spring elements
wherein the stop element includes a strike surface, the stop element strike surface having a first region and a second region;
wherein the first region of the stop element strike surface is coplanar with the second region of the stop element strike surface;
wherein the at least one spring element includes a strike surface; and
wherein the strike surface of the stop element overhangs the strike surface of the at least one spring element so that the first region of the stop element strike surface contacts the strike surface of the at least one spring element when the rocker deflects, and the second region of the stop element strike surface does not contact the strike surface of the at least one spring element when the rocker deflects.

10. The method of claim 9, wherein at least one relief structure is formed in the area of the catch device, and wherein the catch device is formed as a slot penetrating all functional layers of the rocker.

11. The Z-sensor of claim 1, wherein:
the rocker is made up of at least an upper functional layer and a lower functional layer,
the upper functional layer has a lower surface,
the lower functional layer has an upper surface,
the at least one spring element is formed in the lower functional layer of the rocker, and
the stop element is formed in the upper functional layer of the rocker.

12. The method of claim 9, wherein:
the rocker is made up of at least an upper functional layer and a lower functional layer,
the upper functional layer has an upper surface,
the lower functional layer has an upper surface,
the at least one spring element is formed in the lower functional layer of the rocker, and
the stop element is formed in the upper functional layer of the rocker.

* * * * *